(12) United States Patent
Yip

(10) Patent No.: US 10,748,620 B2
(45) Date of Patent: Aug. 18, 2020

(54) MEMORY BLOCK SELECT CIRCUITRY INCLUDING VOLTAGE BOOTSTRAPPING CONTROL

(71) Applicant: Micron Technology, Inc., Boise, ID (US)

(72) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/933,087

(22) Filed: Mar. 22, 2018

(65) Prior Publication Data

US 2019/0295653 A1    Sep. 26, 2019

(51) Int. Cl.
| | |
|---|---|
| *G11C 16/06* | (2006.01) |
| *G11C 16/10* | (2006.01) |
| *H01L 27/11529* | (2017.01) |
| *H01L 27/11573* | (2017.01) |
| *G11C 11/56* | (2006.01) |
| *G11C 16/04* | (2006.01) |

(52) U.S. Cl.
CPC ........ *G11C 16/10* (2013.01); *H01L 27/11529* (2013.01); *H01L 27/11573* (2013.01); *G11C 11/5628* (2013.01); *G11C 11/5671* (2013.01); *G11C 16/0483* (2013.01)

(58) Field of Classification Search
CPC . G11C 16/10; G11C 16/0483; G11C 11/5628; G11C 11/5671; H01L 21/11529; H01L 21/11573; H01L 28/40; H01L 27/11286; H01L 23/53295; H01L 23/535; H01L 21/76898
See application file for complete search history.

(56) References Cited

U.S. PATENT DOCUMENTS

| | | | | |
|---|---|---|---|---|
| 2007/0014184 A1* | 1/2007 | Lee | ........................... | G11C 8/08 365/230.06 |
| 2016/0365352 A1* | 12/2016 | Nishikawa | ........ | H01L 27/11582 |
| 2017/0084335 A1* | 3/2017 | Hahn | ..................... | G11C 16/08 |

* cited by examiner

Primary Examiner — Alfredo Bermudez Lozada
(74) Attorney, Agent, or Firm — Schwegman Lundberg & Woessner, P.A.

(57) ABSTRACT

Some embodiments include apparatuses, and methods of operating the apparatuses. Some of the apparatuses include a first memory cell string; a second memory cell string; a first group of conductive lines to access the first and second memory cell strings; a second group of conductive lines; a group of transistors, each transistor of the group of transistors coupled between a respective conductive line of the first group of conductive lines and a respective conductive line of the second group of conductive lines, the group of transistors having a common gate; and a circuit including a first transistor and a second transistor coupled in series between a first node and a second node, the first transistor including a gate coupled to the second node, and a third transistor coupled between the second node and the common gate.

13 Claims, 8 Drawing Sheets

MEMORY BLOCK SELECT CIRCUITRY INCLUDING VOLTAGE BOOTSTRAPPING CONTROL

BACKGROUND

Memory devices are widely used in computers, cellular phones, and many other electronic items. A conventional memory device, such as a flash memory device, has many memory cells to store information. During a memory operation, different voltages are used. Such voltages can have a relatively high voltage value during some memory operations of the memory device. As described in more detail below, such a high voltage value may cause stress and increase power consumption in some conventional memory devices.

BRIEF DESCRIPTION OF THE DRAWINGS

The techniques described herein relate to controlling values of voltages used in a memory device during memory operations of the memory device. The described memory device includes a first memory cell string; a second memory cell string; a first group of conductive lines (e.g., local word lines) to access the first and second memory cell strings; a second group of conductive lines (e.g., global word lines); and a group of transistors (e.g., string driver transistors). Each transistor of the group of transistors is coupled between a respective conductive line (e.g., a local word line) of the first group of conductive lines and a respective conductive line (e.g., a global word line) of the second group of conductive lines. The group of transistors have a common gate (e.g., a control gate shared by the transistors). The described memory device also includes and a circuit, which includes a first transistor, a second transistor, and a third transistor. The first and second transistors are coupled in series between a first node and a second node. The first transistor includes a gate coupled to the second node. The third transistor is coupled between the second node and the common gate of the group of transistors. The described memory device also includes capacitor structures that can be used in the circuit during memory operations of the memory device.

DETAILED DESCRIPTION

Figure 1:
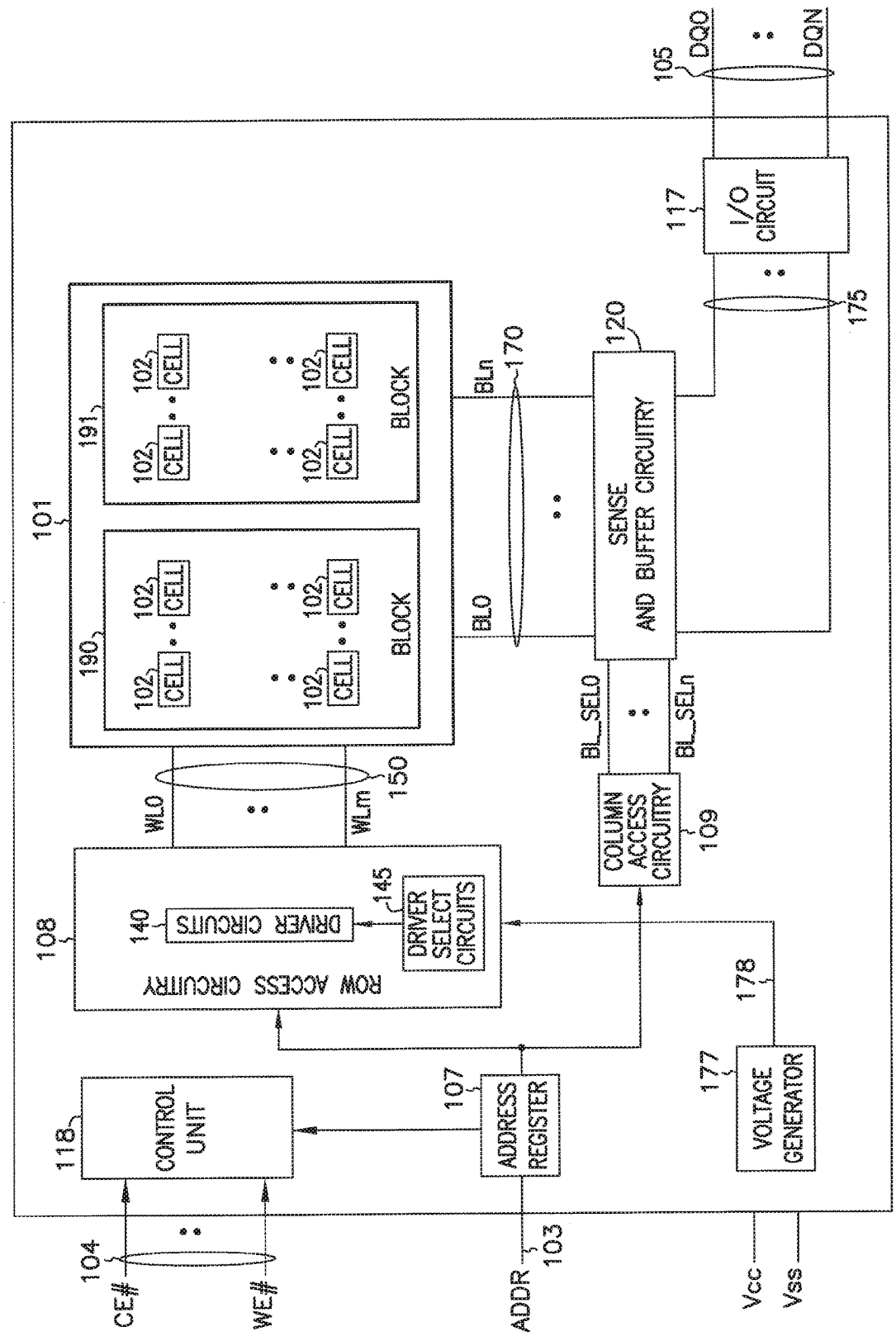
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks 190 and 191. In the physical structure of memory device 100, memory cells 102 can be arranged vertically (e.g., stacked over each other in a 3D arrangement) over a substrate (e.g., a semiconductor substrate) of memory device 100. Alternatively, memory cells 102 can be arranged horizontally (e.g., in a planar or 2D arrangement) over a substrate of memory device 100. FIG. 1 shows memory device 100 having two blocks 190 and 191 as an example. Memory device 100 can have more than two blocks (e.g., hundreds or thousands of blocks).

As shown in FIG. 1, memory device 100 can include access lines (conductive lines that can include word lines) 150 and data lines (conductive lines that can include bit lines) 170. Access lines 150 can carry signals (e.g., word line signals) WL0 through WLm. Data lines 170 can carry signals (e.g., data signals) BL0 through BLn. Memory device 100 can use access lines 150 to selectively access memory cells 102 of blocks 190 and 191, and data lines 170 to selectively exchange information (e.g., data) with memory cells 102 of blocks 190 and 191.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which of blocks 190 and 191 are to be accessed during a memory operation.

Row access circuitry 108 can include driver circuits (e.g., word line drivers) 140 and driver select circuits 145. Examples of driver circuits 140 and driver select circuits 145 are described in more detail with reference to FIG. 2 through FIG. 8. During memory operations of memory device 100 in FIG. 1, driver circuits 140 can operate (e.g., operate as switches) to form (or not to form) conductive paths (e.g., current paths) between respective access lines 150 and nodes (or lines) that provide voltages to access lines 150. Driver select circuits 145 can operate to selectively activate (and deactivate) driver circuits 140 depending on which of the blocks (e.g., block 190 or 191) of memory device 100 is selected to be accessed during a particular memory operation of memory device 100.

Memory device 100 can perform a read operation to read (e.g., sense) information (e.g., previously stored information) from memory cells 102 of blocks 190 and 191, or a write (e.g., programming) operation to store (e.g., program) information in memory cells 102 of blocks 190 and 191. Memory device 100 can use data lines 170 associated with signals BL0 through BLn to provide information to be stored in memory cells 102 or obtain information read (e.g., sensed) from memory cells 102. Memory device 100 can also perform an erase operation to erase (e.g., clear) information from some or all of memory cells 102 of blocks 190 and 191.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 is to perform.

Memory device 100 can include sense and buffer circuitry 120, which can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 190 and 191 and provide the value of the information to lines (e.g., global data lines) 175. Sense and buffer circuitry 120 can also be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 190 and 191 and lines (e.g., I/O lines) 105. Signals DQ0 through DQN on lines 105 can represent information read from or to be stored in memory cells 102 of blocks 190 and 191. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105. For example, a controller (e.g., a memory controller or a processor) can send commands (e.g., read, write, and erase commands) to memory device 100 to cause memory device 100 to perform memory operations described herein with respect to FIG. 1 through FIG. 8.

Memory device 100 can receive voltages (e.g., supply voltages) Vcc and Vss. Voltage Vcc can have a positive value (e.g., Vcc>0V). Voltage Vss can operate at a ground potential (e.g., Vss=0V). Voltage Vcc can include an external voltage supplied to memory device 100 from an external power source such as a battery, or alternatively from alternating current to direct current (AC-DC) converter circuitry.

Memory device 100 can include a voltage generator 177 to generate different voltages (not labeled in FIG. 1) and provide the generated voltages at outputs 178. The voltages at outputs 178 can be used during different memory operations of memory device 100. Voltage generator 177 can include circuit components (e.g., charge pumps) to generate voltages that can have different values, and such values can be greater than (or less than) the value of voltage Vcc. The voltages at outputs 178 can be similar to (or identical to) the voltages described below with reference to FIG. 2 through FIG. 8.

In FIG. 1, each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. A cell capable of storing a single bit is sometimes called a single-level cell (or "SLC"). In another example, each of memory cells 102 can be programmed to store information representing a value for multiple bits, such as one of four possible values "00", "01", "10", and "11" of two bits, one of eight possible values "000", "001", "010", "011", "100", "101", "110", and "11" of three bits, or one of other values of another number of multiple bits. A cell that has the ability to store multiple bits is sometimes called a multi-level cell (or multi-state cell). In some contexts in the industry, the term multi-level cell (or MLC) is used to refer to a memory cell that can store two bits of data per cell (e.g., one of four programmed states), the term triple-level cell (TLC) is used to refer to a memory cell that can store three bits of data per cell (e.g., one of eight programmed states), and the term quad-level cell (QLC) is used to refer to a cell that can store four bits of data per cell (e.g., one of sixteenth programmed states). For purposes of the present description, unless expressly indicated otherwise, the term multi-level cell (or MLC) will be used in the broader context to refer to a memory cell that can store two or more bits of data per cell. Thus, the term multi-level cell is generic to both triple level cells, quad level cells, and future memory cell configurations capable of storing more than four bits of data per cell.

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as, by way of example but not limitation, a variable resistance memory device (e.g., a phase change memory device (of various configurations), a resistive Random Access Memory (RAM) device, or a magnetoresistive random-access memory (MRAM) device. For purposes of the present description, the device will be described in the context of a NAND flash memory device.

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 8.

Figure 2:
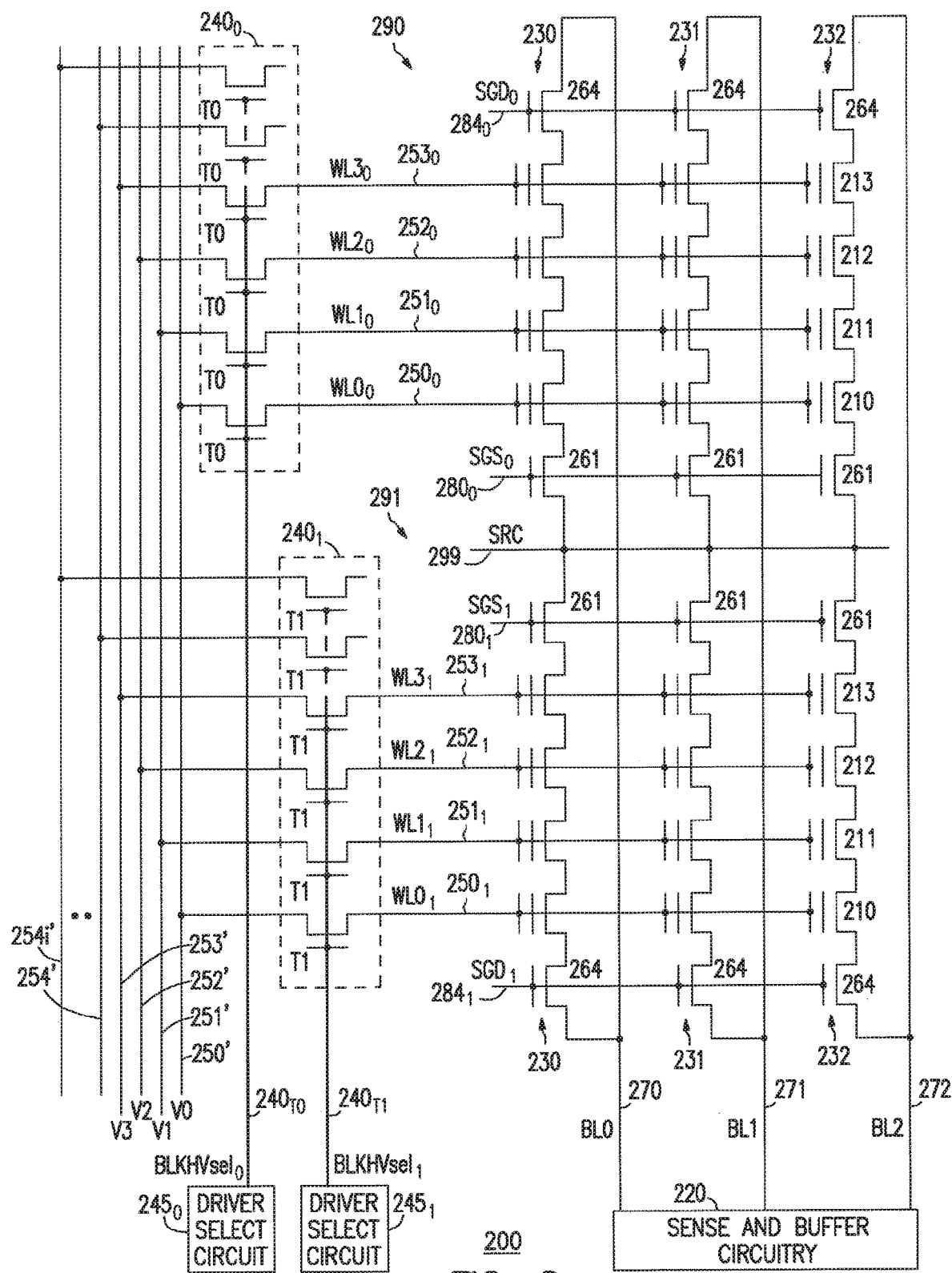
FIG. 2 shows a schematic diagram of a portion of a memory device including blocks of memory cells, driver circuits, and driver select circuits, according to some embodiments described herein.

FIG. 2 shows a schematic diagram of a portion of a memory device 200 including blocks (blocks of memory cells) 290 and 291, driver circuits $240_0$ and $240_1$, and driver select circuits $245_0$ and $245_1$, according to some embodiments described herein. Memory device 200 can correspond to memory device 100 of FIG. 1, such that blocks 290 and 291 can correspond to blocks 190 and 191, respectively, of FIG. 1, driver circuits $240_0$ and $240_1$ can correspond to driver circuits 140 of FIG. 1, and driver select circuits $245_0$ and $245_1$ can correspond to driver select circuits 145 of FIG. 1.

As shown in FIG. 2, blocks 290 and 291 can have similar elements. Thus, for simplicity, similar elements between blocks 290 and 291 are given the same labels (e.g., same reference numbers). The following description focuses on the description of block 290. The elements of block 291 can have a similar description (which is not described in detail below for simplicity).

Block 290 can include memory cells 210, 211, 212, and 213, select transistors (e.g., source select transistors) 261, and select transistors (e.g., drain select transistors) 264. Memory cells 210, 211, 212, and 213 can be arranged in respective memory cell strings, such as memory cell strings 230, 231, and 232 in the depicted example shown in FIG. 2. Memory device 200 can include a line 299 that can carry a signal SRC (e.g., source line signal). Line 299 can be structured as a conductive region (e.g., a conductive line) that can form part of a source (e.g., a source line) shared by blocks 290 and 291 of memory device 200.

As shown in FIG. 2, memory device 200 can include data lines (e.g., bit lines) 270, 271, and 272 that can carry signals (e.g., data signals) BL0, BL1, and BL2, respectively. Data lines 270, 271, and 272 can correspond to some of data lines 170 of FIG. 1. Each of memory cell strings 230, 231, and 232 of block 290 can be coupled to one of data lines 270, 271, and 272 through one of select transistors 264. Each of memory cell strings 230, 231, and 232 of block 290 can also be coupled to line 299 through one of select transistors 261. For example, memory cell string 230 of block 290 can be coupled to data line 270 through select transistor 264 (directly over memory cell string 230) and to line 299 through select transistor 261 (directly under memory cell string 230). In another example, memory cell string 231 of block 290 can be coupled to data line 271 through select transistor 264 (directly over memory cell string 231) and to line 299 through select transistor 261 (directly under memory cell string 231).

FIG. 2 shows an example of three memory cell strings 230, 231, and 232, and four memory cells 210, 211, 212, and 213 in each memory cell string of block 290 (and block 291). However, the number of memory cell strings and the number of memory cells in each memory cell string of block 290 can vary.

As shown in FIG. 2, memory device 200 can include sense and buffer circuitry 220 coupled to data lines 270, 271, and 272. Sense and buffer circuitry 220 of memory device 200 can operate (e.g., during a read operation) to sense information read from memory cells 210, 211, 212, and 213 of a block (e.g., block 290 or 291) being accessed (e.g., a selected block). Sense and buffer circuitry 220 can also operate (e.g., during a write operation) to provide information to be stored in memory cells 210, 211, 212, and 213 of a block (e.g., block 290 or 291) being accessed (e.g., a selected block).

Memory device 200 can include a group of conductive lines (e.g., local access lines, such as, for example local word lines) $250_0$, $251_0$, $252_0$, and $253_0$ in block 290. Some memory cells (e.g., memory cells in the same row) of different memory cell strings of the same block can be coupled to and controlled by (e.g., can share) the same conductive line of that block. For example, memory cells 213 of block 290 can be coupled to and controlled by (e.g., can share) the same conductive line (e.g., $253_0$). In another example, memory cells 212 of block 290 can be coupled to and controlled by (e.g., can share) the same conductive line (e.g., $252_0$).

Each of conductive lines $250_0$, $251_0$, $252_0$, and $253_0$ can be structured as a single conductive line (e.g., a single conductive region) that can be formed from conductive material (e.g., conductively doped polysilicon). During a memory operation of memory device 200, conductive lines $250_0$, $251_0$, $252_0$, and $253_0$ can receive respective signals $WL0_0$, $WL1_0$, $WL2_0$, and $WL3_0$ to access memory cells 210, 211, 212, and 213 of selected memory cell strings.

Select transistors (e.g., drain select transistors) 264 of block 290 can be coupled to select line (e.g., drain select line) $284_0$. Select transistors 264 of block 290 can be controlled (e.g., turned on or turned off) by the same signal, such as signal $SGD_0$ (e.g., drain select gate signal) on select line $284_0$.

Select transistors (e.g., source select transistors) 261 of block 290 can be coupled to a select line (e.g., source select line) $280_0$. Select transistors 261 of block 290 can be controlled (e.g., turned on or turned off) by the same signal, such as signal $SGS_0$ (e.g., source select gate signal) applied to select line $280_0$.

As mentioned above, block 291 includes elements similar to those of block 290. For example, block 291 can include memory cell strings 230, 231, and 232, and a group of conductive lines (e.g., local access lines or local word lines) $250_1$, $251_1$, $252_1$, and $253_1$ that can receive respective signals $WL0_1$, $WL1_1$, $WL2_1$, and $WL3_1$ to access memory cells 210, 211, 212, and 213 of selected memory cell strings in block 291. In another example, block 291 can include select transistors 261, select line (e.g., source select line) $280_1$ and corresponding signal $SGS_1$ (e.g., source select gate signal), and select line (e.g., drain select line) $284_1$ and corresponding signal $SGD_1$ (drain select gate signal).

During a memory operation (e.g., a read or write operation) select transistors 264 of block 290 can be turned on (e.g., by activating signal $SGD_0$) to couple (e.g., electrically couple) memory cell strings 230, 231, and 232 of block 290 to data lines 270, 271, and 272, respectively. When select transistors 264 of block 290 are turned on during a particular memory operation, select transistors 264 of block 291 can be turned off (e.g., by deactivating signal $SGD_1$) to decouple (e.g., electrically decouple) memory cell strings 230, 231, and 232 of block 291 from data lines 270, 271, and 272, respectively. This allows memory cell strings 230, 231, and 232 of either block 290 or block 291 (e.g., one block at a time) to be electrically coupled to data lines 270, 271, and 272 during a particular memory operation of memory device 200.

During a memory operation, such as a read or write operation, select transistors 261 of block 290 can be turned on (e.g., by activating signal $SGS_0$) to couple (e.g., electrically couple) memory cell strings 230, 231, and 232 of block 290 to line 299. When select transistors 261 of block 290 are turned on during a particular memory operation, select transistors (e.g., source select transistors) 261 of block 291 can be turned off (e.g., by deactivating signal $SGS_1$) to decouple (e.g., electrically decouple) memory cell strings 230, 231, and 232 of block 291 from line 299.

Each of blocks 290 and 291 can have a unique block address (block-level address) within memory device 200. During a memory operation (e.g., read, write, or erase operation), only one of blocks 290 and 291 can be selected based on the block address. Memory device 200 can use an address register (which can be similar to address register 107 in FIG. 1) and row access circuitry (which can be similar to row access circuitry 108 in FIG. 1) to determine which block (e.g., either block 290 or 291) of memory device 200 is selected to be accessed during a particular memory operation. The block address of the selected block during a particular memory operation can be provided to memory device 200 through lines (e.g., address lines) such as lines 103 of FIG. 1. Memory device 200 can activate (e.g., turn on) the driver circuit (e.g., driver circuit $240_0$) associated with the selected block (e.g., block 290) to access the memory cells (e.g., selected memory cells) of the selected block. Memory device 200 can deactivate (e.g., turn off) the driver circuit (e.g., driver circuit $240_1$) associated with the unselected (e.g., deselected) block (e.g., block 291).

As shown in FIG. 2, driver circuit $240_0$ can include a group of transistors (e.g., high-voltage string driver transistor) T0. Transistors T0 can share a transistor gate $240_{T0}$ (e.g., a common transistor gate $240_{T0}$, which is a transistor control gate shared by transistors T0). Thus, transistors T0 can be controlled (e.g., concurrently turned on or concurrently turned off) using the signal (e.g., voltage) on the same transistor gate $240_{T0}$.

Driver circuit $240_1$ can include a group of transistors (e.g., high-voltage string driver transistor) T1. Transistors T1 can share a transistor gate $240_{T1}$ (e.g., a common transistor gate $240_{T1}$, which is a transistor control gate shared by transistors T1 and different from transistor gate $240_{T0}$). Thus, transistors T1 can be controlled (e.g., turned on at the same time or turned off at the same time) using the signal (e.g., voltage) on the same transistor gate $240_{T1}$.

Memory device 200 can include conductive lines (e.g., global access lines, such as, for example global word lines) 250', 251', 252', 253', and 254' through 254i', each of which can be provided with (e.g., can carry) a voltage (e.g., a voltage signal, which is different from a data signal). As an example, conductive lines 250', 251', 252', and 253' can be provided with voltages (e.g., voltage signals) V0, V1, V2, and V3, respectively. Each of conductive lines 250'. 251', 252', 253', and 254' through 254i' can be structured with (e.g., formed from) a conductive material (e.g., conductively doped polysilicon, metal, or other conductive materials).

As shown in FIG. 2, some (e.g., four) of transistors T0 can be coupled between conductive lines 250', 251', 252', and 253' and conductive lines $250_0$, $251_0$, $252_0$, and $253_0$, respectively, of block 290. Some (e.g., four) of transistors T1 can be coupled between conductive lines 250', 251', 252', and 253' and conductive lines $250_1$, $251_1$, $252_1$, and $253_1$, respectively, of block 291.

For simplicity, FIG. 2 omits connections (e.g., conductive connections) between conductive lines 254' through 254i' and some elements of blocks 290 and 291. Such connections include connections between conductive lines 254' through 254i' and select lines $280_0$ and $284_0$ (of block 290), select lines $280_1$ and $284_1$ (of block 291), and line (e.g., source line) 299.

Driver circuit $240_0$ can use transistors T0 to provide (e.g., to pass) voltages from conductive lines 250', 251', 252', 253', and 254' through 254i' to respective elements of block 290. For example, driver circuit $240_0$ can use four of transistors T0 to provide voltages V0, V1, V2, and V3 from four corresponding conductive lines 250', 251', 252', and 253' to four conductive lines $250_0$, $251_0$, $252_0$, and $253_0$, respectively.

Driver circuit $240_1$ can use transistors T1 to provide (e.g., to pass) voltages from conductive lines 250', 251', 252', 253', and 254' through 254i' to respective elements of block 291. For example, driver circuit $240_1$ can use four of transistors T1 to provide voltages V0, V1, V2, and V3 from four corresponding conductive lines 250', 251', 252', and 253' to four conductive lines $250_1$, $251_1$, $252_1$, and $253_1$, respectively, of block 291.

As shown in FIG. 2, transistor gates $240_{T0}$ and $240_{T1}$ are separate from each other. Thus, driver circuits $240_0$ and $240_1$ can separately use respective transistor gates $240_{T0}$ and $240_{T1}$ (e.g., separately activate respective signals BLKHVsel$_0$ and BLKHVsel$_1$) to control (e.g., turn on or turn off) transistors T0 and T1. Driver circuits $240_0$ and $240_1$ can be activated one at a time during a particular memory operation of memory device 200.

For example, during a memory operation of memory device 200, if block 290 is selected to be accessed (e.g., to operate on memory cells 210, 211, 212, and 213 of block 290) and block 291 is not selected (unselected) to be accessed, then signal BLKHVsel$_0$ can be activated by driver select circuit $245_0$ while signal BLKHVsel$_1$ is not activated (e.g., deactivated) by driver select circuit $245_1$. In this example, transistors T0 can be turned on (while transistors T1 are turned off) to establish circuit paths (e.g., current paths) between conductive lines $250_0$, $251_0$, $252_0$, and $253_0$ of memory cell block 290 (e.g., the selected block) and conductive lines 250', 251', 252', and 253' (e.g., through turned-on transistors T0), respectively. This allows voltages V0, V1, V2, and V3 from respective conductive lines 250', 251', 252', and 253' to be applied to (e.g., to be passed to) respective conductive lines $250_0$, $251_0$, $252_0$, and $253_0$ of block 290 through turned-on transistors T0. In this example, memory device 200 may establish no circuit paths (e.g., establish no current paths) between conductive lines $250_1$, $251_1$, $252_1$, and $253_1$ of memory cell block 291 (e.g., the unselected block) and respective conductive lines 250', 251', 252', and 253' (because transistors T1 are turned off). Thus, in this example, voltages V0, V1, V2, and V3 from respective conductive lines 250', 251', 252', and 253' are not applied to (e.g., are not passed to) conductive lines $250_1$, $251_1$, $252_1$, and $253_1$ of block 291 because transistors T1 are turned off.

In another example, during a memory operation of memory device 200, if block 291 (instead of block 290 as described in the above example) is selected to be accessed (e.g., to operate on memory cells 210, 211, 212, and 213 of block 291) and block 290 is not selected to be accessed, then signal BLKHVsel$_1$ can be activated by driver select circuit $245_1$ while signal BLKHVsel$_0$ is not activated (e.g., deactivated) by driver select circuit $245_0$. In this example, transistors T1 can be turned on while transistors T0 are turned off. This allows voltages V0, V1, V2, and V3 from respective conductive lines 250', 251', 252', and 253' to be applied to (e.g., to be passed to) respective conductive lines $250_1$, $251_1$, $252_1$, and $253_1$ of block 291 through turned-on transistors T1. In this example, voltages V0, V1, V2, and V3 from respective conductive lines 250', 251', 252', and 253' are not applied to (e.g., are not passed to) conductive lines $250_0$, $251_0$, $252_0$, and $253_0$ because transistors T0 are turned off.

Each of driver select circuits $245_0$ and $245_1$ can include elements (e.g., transistors and capacitors) similar to (or identical to) the elements of driver select circuits described in more detail with reference to FIG. 3 through FIG. 8. Improvements and benefits of memory device 200 over some conventional memory devices are also discussed below with reference to FIG. 3 through FIG. 8.

Figure 3:
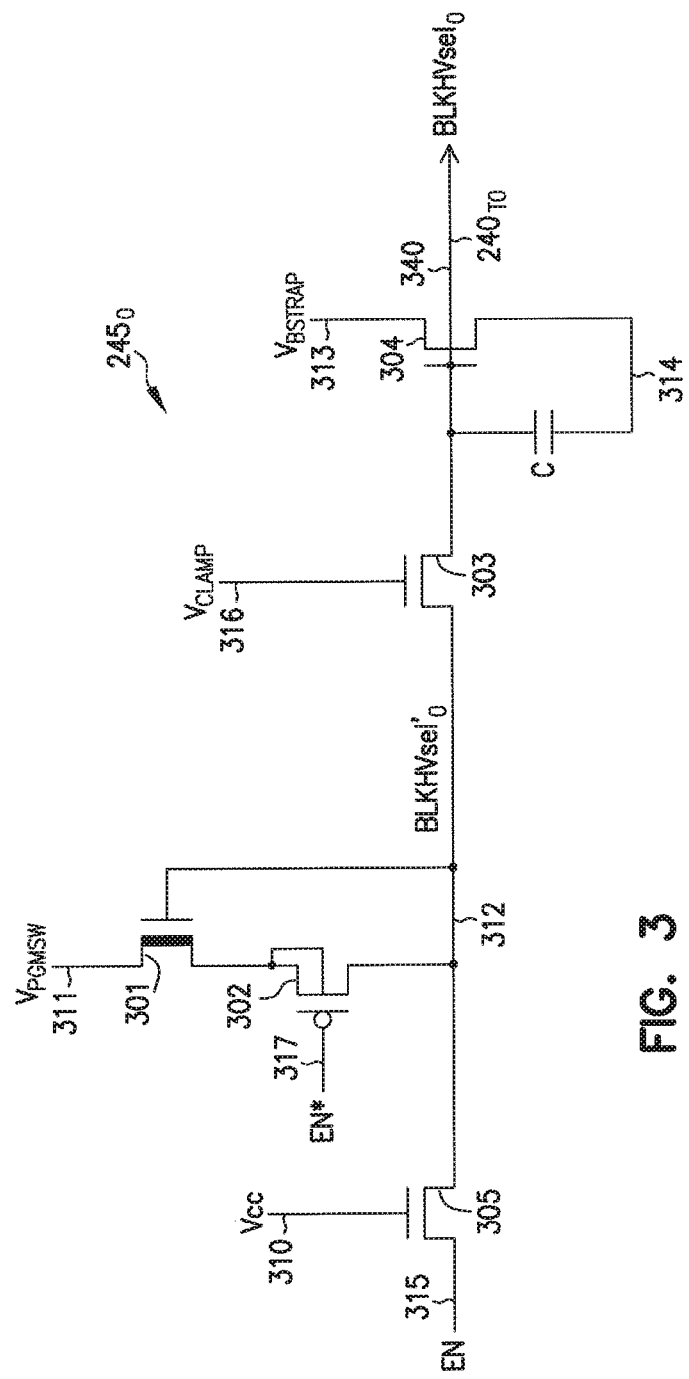
FIG. 3 shows a schematic diagram of a driver select circuit of the memory device of FIG. 2, according to some embodiments described herein.

FIG. 3 shows a schematic diagram of driver select circuit $245_0$ of memory device 200 of FIG. 2, according to some embodiments described herein. For simplicity, only driver select circuit $245_0$ of memory device 200 of FIG. 2 is described in detail with respect to FIG. 3. Driver select circuit $245_1$ of memory device 200 of FIG. 2 includes elements and operations similar to the elements and operations of driver select circuit $245_0$ shown in FIG. 3. Thus, detailed description of driver select circuit $245_1$ of FIG. 2 is omitted from the description herein.

As shown in FIG. 3, driver select circuit $245_0$ can include transistors 301, 302, 303, 304, and 305, and a capacitor C. Each of transistors 301, 303, 304, and 305 can include an n-channel metal-oxide-semiconductor (NMOS) transistor. Transistor 302 can include a p-channel metal-oxide-semiconductor (PMOS) transistor. Transistor 301 can include a depletion-mode NMOS transistor, such that transistor 301 can have a negative threshold voltage Vt (Vt<0). Transistor 303 can include a depletion-mode NMOS transistor, such that transistor 303 can have a negative threshold voltage Vt (Vt<0). Alternatively, transistor 303 can include an enhancement mode NMOS transistor.

As shown in FIG. 3, driver select circuit $245_0$ can include nodes (e.g., power supply nodes) 310, 311, 313, and 316 to receive voltages (e.g., voltage signals) Vcc, $V_{PGMSW}$, $V_{BSTRAP}$, and $V_{CLAMP}$, respectively, and nodes (e.g., enable signal nodes) 315 and 317 to receive signals (e.g., enable signals) EN and EN*, respectively. Signals EN and EN* can be complementary signals (e.g., signal EN* is an inverted version of signal EN). Driver select circuit $245_0$ can also include a node (e.g., high-voltage node) 340 to provide voltage $BLKHVsel_0$. Node 340 can be coupled (electrically coupled) to transistor gate $240_{T0}$ of transistors T0 (FIG. 2). Thus, node 340 of driver select circuit $245_0$ and transistor gate $240_{T0}$ can be the same node (e.g., can be coupled to the same conductive region (e.g., conductive path)).

In operation, if block 290 (FIG. 2) is selected to store information in at least one of memory cells 210, 211, 212, and 213 of block 290, then signals EN and EN* can be provided with voltages (e.g., EN=Vcc, and EN*=0V) to turn on transistors 305 and 302, respectively. Transistors 301 and 302 can operate to cause the value of voltage $BLKHVsel'_0$ at node 312 to be based on (e.g., to increase up to) the value of voltage $V_{PGMSW}$ at node 311. Transistor 304 can include a gate coupled to node 340, a terminal (e.g., a non-gate terminal (e.g., a drain)) coupled to node 313, and a terminal (e.g., a non-gate terminal (e.g., a source)) coupled to node 314. Transistor 304 can operate to pass voltage $V_{BSTRAP}$ to one conductive plate (e.g., the conductive plate coupled to node 314) of capacitor C. Capacitor C can operate as bootstrap capacitor. Capacitor C and transistor 304 can operate to cause (to increase (e.g., to bootstrap)) the value of voltage $BLKHVsel_0$ at node 340 to be greater than the value of voltage $BLKHVsel'_0$ at node 312. Voltage $V_{CLAMP}$ can have a value less than the value of voltage $V_{PGMSW}$ by one threshold voltage value of transistor 303. This may allow transistor 303 to form a conductive path from node 312 to node 340 and also to prevent the voltage (e.g., $BLKHVsel_0$ of at least 29V) at node 340 from drifting back to the voltage (e.g., $BLKHVsel'_0$=26V) at node 312.

During a write operation of memory device 200, a relatively high value of voltage $BLKHVsel_0$ at node 340 allows transistors T0 (FIG. 2) to properly pass a voltage (e.g., a programming voltage) from a conductive line (e.g., a selected global word line) among conductive lines (e.g., global word lines) 250', 251', 252', and 253' to a respective conductive line (e.g., a selected local word line) among conductive lines (e.g., local word lines) $250_0$, $251_0$, $252_0$, and $253_0$. This allows information to be properly stored in a memory cell (or memory cells) of block 290.

Figure 4:
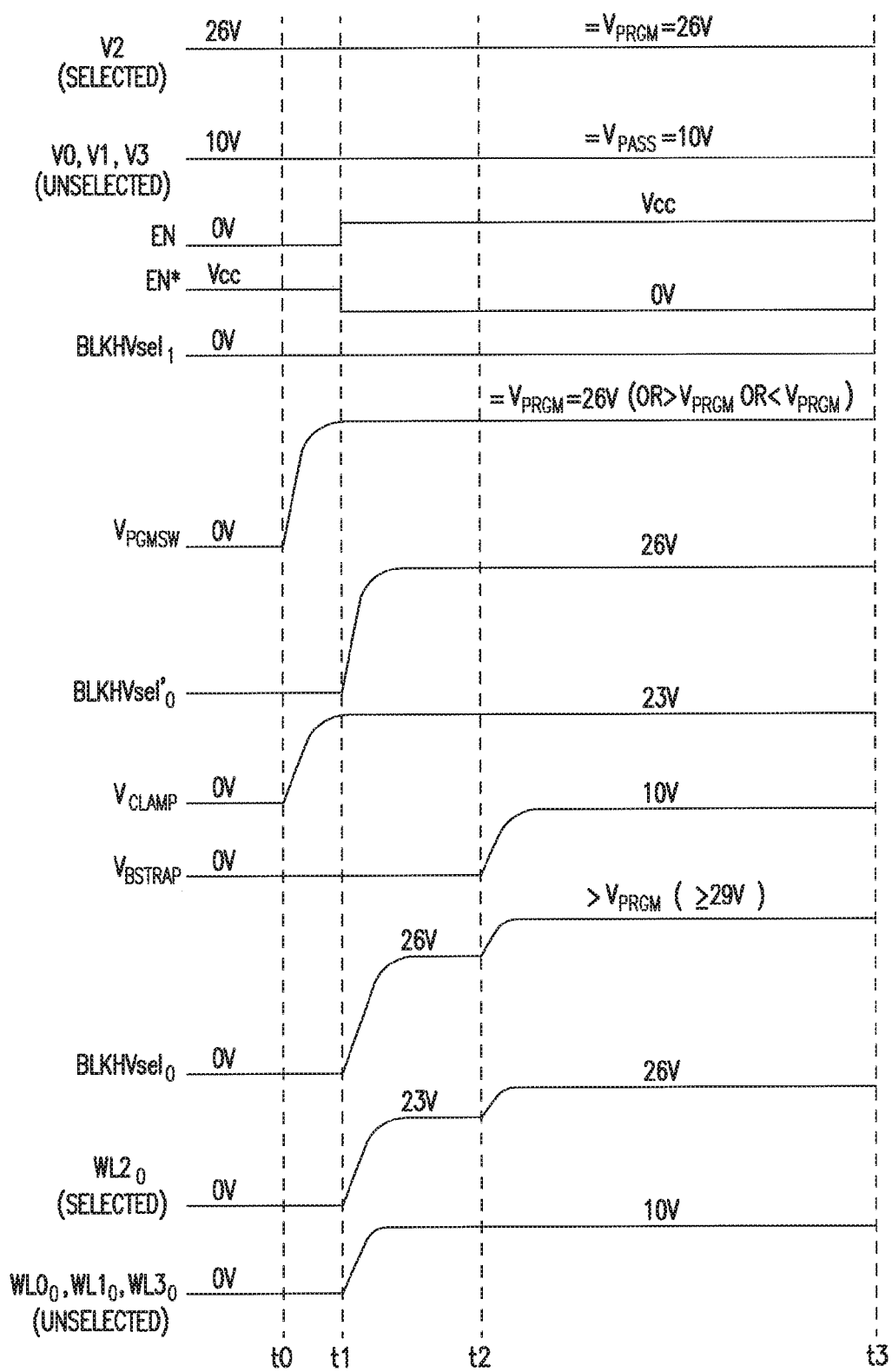
FIG. 4 is a timing diagram for some of the signals of the memory device of FIG. 2 and some of the voltages shown in FIG. 3 during an example write operation of the memory device, according to some embodiments described herein.

FIG. 4 is a timing diagram for some of the signals of memory device 200 of FIG. 2 and some of the voltages shown in FIG. 3 during an example write operation of memory device 200, according to some embodiments described herein. In the write operation associated with FIG. 4, it is assumed that block 290 (FIG. 2) is selected to store information (e.g., block 291 is not selected to store information). In the write operation associated with FIG. 4, it is also assumed that at least one of memory cells 212 (e.g., one memory cell 212 or multiple memory cells 212) associated with conductive line $252_0$ (e.g., local word line) of FIG. 2 is selected to be accessed (e.g., selected to store information). Thus, in this example, conductive line $252_0$ (FIG. 2) can be called a selected conductive line (e.g., selected local word line). In FIG. 4, signal $WL2_0$ is labeled "selected" to indicate that signal $WL2_0$ is associated with selected conductive line $252_0$ (e.g., selected local word line).

In the example write operation of FIG. 4, other memory cells 210, 211, and 213 (FIG. 2) associated with conductive lines $250_0$, $251_0$, and $253_0$, respectively, are unselected (e.g., not selected) memory cells (e.g., memory cells that are not selected to store information). Thus, in this example, conductive lines $250_0$, $251_0$, and $253_0$ (FIG. 2) can be called unselected conductive lines (e.g., unselected local word lines). In FIG. 4, signals $WL0_0$, $WL1_0$, and $WL3_0$ are labeled "unselected" to indicate that signals $WL0_0$, $WL1_0$, and $WL3_0$ are associated with unselected conductive lines $250_0$, $251_0$, and $253_0$, respectively.

In the description herein, the values (e.g., voltage values) of voltages being described (and shown in the drawings) are example values. However, actual values used in reality can be different from the values shown in FIG. 4.

In FIG. 4, times t0, t1, t2, and t3 indicate different times during the example write operation. Information can be stored (e.g., programmed) in a selected memory cell (or memory cells) between times t2 and t3.

As shown in FIG. 4, voltages V0, V1, V2, and V3 associated with conductive lines 250', 251', 252', and 253' (FIG. 2) can be provided with different values depending on which of conductive lines 250', 251', 252', and 253' is a selected conductive line (e.g., selected global word line). A selected conductive line (e.g., selected global word line) among conductive lines 250', 251', 252', and 253' is the conductive line associated with (e.g., coupled to) a selected conductive line (e.g., selected local word line) among conductive lines $250_0$, $251_0$, $252_0$, and $253_0$ through one of transistors T0 (FIG. 2). Thus, in the example write operation of FIG. 4, conductive line 252' (FIG. 2) is a selected conductive line (e.g., selected global word line). In FIG. 4, voltage V2 is labeled "selected" to indicate that voltage V2 is associated with selected conductive line 252' (e.g., selected global word line). Other conductive lines 250', 251', and 253' in the example write operation of FIG. 4 can be called unselected conductive lines (e.g., unelected global word lines). In FIG. 4, voltages V0, V1, and V3 are labeled "unselected" to indicate that voltages V0, V1, and V3 are associated with unselected conductive lines 250', 251', and 253' (e.g., unselected global word lines).

As shown in FIG. 4, voltage V2 (e.g., associated with a selected global word line) can be provided with a programming voltage $V_{PRGM}$ (e.g., $V_{PRGM}$=26V). Each of voltages V0, V1, and V3 (e.g., associated with unselected global word lines) can be provided with a voltage $V_{PASS}$ (e.g., $V_{PASS}$=10V). Thus, during a write operation of memory device 200, one of conductive lines 250', 251', 252', and 253' can be provided with a voltage (e.g., V2=$V_{PRGM}$=26V) that has a highest value (e.g., 26V) among values of voltages (e.g., voltages V0=V1=V3=10V and V2=26V) received at respective conductive lines 250', 251', 252', and 253'.

Voltage $V_{PGMSW}$ can be based on programming voltage $V_{PRGM}$ (e.g., $V_{PGMSW}$=$V_{PRGM}$). For example, $V_{PGMSW}$=26V, which can be the same as the value of voltage V2 (and the same as the value of programming voltage $V_{PRGM}$=26V). Thus, during a write operation of memory device 200, the value of voltage $V_{PGMSW}$ can be no greater than (at most equal to) a highest value (e.g., the value of voltage V2) among values of the voltages (e.g., voltages V0=V1=V3=10V and V2=26V) received at respective conductive lines 250', 251', 252', and 253'.

FIG. 4 also shows labels $V_{PGMSW}$=$V_{PRGM}$, $V_{PGMSW}$<$V_{PRGM}$, and $V_{PGMSW}$>$V_{PRGM}$ to indicate that the value of voltage $V_{PGMSW}$ can alternatively be less than or greater than the value of programming voltage $V_{PRGM}$.

Signals EN and EN* can be provided with 0V and the value of voltage Vcc, respectively, as shown in FIG. 4.

The value of voltage BLKHVsel'$_0$ is based on (e.g., follows) the value of voltage $V_{PGMSW}$. As shown in FIG. 4, the value of voltage BLKHVsel'$_0$ can go up to the value of voltage $V_{PGMSW}$ (e.g., goes from 0V to 23V).

Voltage $V_{CLAMP}$ can be provided with a value that is less than the value of voltage $V_{PGMSW}$. For example, voltage $V_{CLAMP}$ can be provided with a value such that $V_{CLAMP}=V_{PGMSW}+Vt$ (where Vt is the threshold voltage of transistor 303 (FIG. 3)). As an example, if $V_{PGMSW}=26V$ and $Vt=-3V$, then $V_{CLAMP}=26V+Vt=26V-3V=23V$ (as shown in FIG. 4).

Voltage $V_{BSTRAP}$ can be provided with a value less than the value of voltage $V_{CLAMP}$ and greater than the value of voltage Vcc. For example, the value of voltage $V_{BSTRAP}$ can be 10V if the value of voltage Vcc is between 1V and 2V and the value of voltage $V_{CLAMP}=23V$.

Voltages provided to signals WL0$_0$, WL1$_0$, WL2$_0$, and WL3$_0$ can be based on voltages V0, V1, V2, and V3, respectively. For example, the value of a voltage on signal WL2$_0$ can be up to the value of programming voltage $V_{PRGM}$. As an example, the value of a voltage on signal WL2$_0$ can go up to $V_{PRGM}=V2=26V$.

The value of a voltage on each of signals WL0$_0$, WL1$_0$, and WL3$_0$ can be based on the value of voltage $V_{PASS}$. As an example, the value of a voltage on each of signals WL0$_0$, WL1$_0$, and WL3$_0$ can go up to $V_{PASS}=10V$.

In the example write operation of FIG. 4, block 291 is not selected to store information. Thus, driver circuit 240$_1$ (FIG. 2) can be deactivated (e.g., by turning off transistors T1) by providing a turned-off value (e.g., 0V) to voltage BLKHVsel$_1$ between times t0 and t3 (as shown in FIG. 4).

Voltage BLKHVsel$_0$ can depend on the values of voltage $V_{PGMSW}$, voltage $V_{CLAMP}$, threshold voltage Vt of transistor 303, and the capacitance (e.g., coupling capacitance) at node 340. Voltage BLKHVsel$_0$ can have a value greater than the value of voltage $V_{PGMSW}$, such that BLKHVsel$_0$ can be at least (equal to or greater than) the sum of $V_{PGMSW}+Vx$, where Vx is at least the absolute value of the threshold voltage Vt of transistor 303. For example, if the value of voltage $V_{PGMSW}$ is 26V, and the value of threshold voltage Vt of transistor 303 is negative 3V (−3V), then the value of voltage BLKHVsel$_0$ can be 29V (26V+3V=29V) or greater than 29V.

As shown in FIG. 4, as voltage $V_{BSTSAP}$ ramps up (e.g., between times t2 and t3), voltage BLKHVsel$_0$ also ramps up through coupling. The amount of coupling can be dependent on the coupling ratio between capacitor C (FIG. 3) and the capacitance associated with transistors T0. The amount of coupling at node 340 can be proportional to the size (e.g., the capacitance) of capacitor C. Thus, the larger the size of capacitor C, the higher the amount of coupling at node 340. As an example, if the capacitance of capacitor C and the capacitance associated with transistors T0 are equal, then the coupling ratio can be approximately 50%. Thus, if capacitor C is formed from transistors and N=T (where N is the number of transistors that form capacitor C, and T is the number of transistors T0), then approximately 50% of voltage $V_{BSTRAP}$ at node 313 will contribute to (e.g., show up in) the value of voltage BLKHVsel$_0$ at node 340. For example, if voltage $V_{BSTRAP}=10V$, then 5V (50% of 10V) of voltage BLKHVsel$_0$ is from voltage $V_{BSTRAP}$. In this example, if $V_{PGMSW}=26V$, then BLKHVsel'$_0=26V$, and BLKHVsel$_0$ can be increased from 26V (the value of voltage BLKHVsel'$_0$) to 31V (26V+5V). Thus, in FIG. 4, the value of voltage BLKHVsel$_0$ can be 31V between times t2 and t3.

Using driver select circuit 245$_0$ of FIG. 2 and FIG. 3 and the voltages shown in FIG. 4 allows memory device 200 (FIG. 2) to have improvements and benefits over some conventional memory devices. Some such improvements and benefits are discussed below.

For example, some conventional memory devices may use a control voltage (e.g., a voltage similar to $V_{PGMSW}$) and programming voltage (e.g., a voltage similar to $V2=V_{PGMSW}$) during storing (programming) information in a memory cell. Such a control voltage in the conventional memory devices normally has a value (e.g., 29V) that is at least one threshold voltage (e.g., one Vt of transistors similar to transistors T0) greater than the value (e.g., 26V) of the programming voltage (e.g., the voltage applied to a selected word line associated with the memory cell being programmed). In such conventional memory devices, generating such a control voltage is unavoidably inefficient due to factors that may include junction loading each block in the memory device, and routing loading. Further, memory cell programming normally benefits from a relatively high programming voltage. However, in some conventional memory devices, providing such a high programming voltage can be challenging due to constraints such as poor charge pump efficiency, and to breakdown of components (e.g., complementary-metal-oxide semiconductor (CMOS) circuitries) needed to generate such a programming voltage.

In memory device 200, the value of voltage $V_{PGMSW}$ at node 311 may be kept relatively low (e.g., 26V) in comparison to the value (e.g., 29V) of a similar voltage used in conventional memory devices. Although the value of voltage $V_{PGMSW}$ is kept relatively low, the value of voltage BLKHVsel$_0$ applied to transistor gate 240$_{T0}$ can still be high enough (e.g., 29V or greater than 29V) to maintain proper operation of storing information in a memory cell in memory device 200. For example, the value of voltage $V_{PGMSW}$ can be selected to be relatively low, such as less than (or equal to) the value of programming voltage $V_{PRGM}$. Although the value of voltage $V_{PGMSW}$ can be selected to be less than or equal to the value of programming voltage $V_{PRGM}$, the value of voltage $V_{PGMSW}$ can also be selected to be greater than the value of programming voltage $V_{PRGM}$. For example, $V_{PGMSW}=V_{PRGM}+Vz$, where Vz can be less than, equal to, or greater than the value of the threshold voltage of transistors T0.

The relatively low value of voltage $V_{PGMSW}$ (e.g., $V_{PGMSW}$<BLKHVsel$_0$) may improve efficiency in generating voltage $V_{PGMSW}$ in comparison to generation of a similar voltage in some conventional memory devices. Further, the relatively low value of voltage $V_{PGMSW}$ can reduce stress associated with generation of voltage $V_{PGMSW}$ (e.g., reduce stress associated with a charge pump and signal path to node 311) in comparison with generation of a similar voltage in some conventional memory devices. Moreover, in comparison with some conventional memory devices, power consumption (e.g., supply current Icc consumption) of memory device 200 may also be relatively low due to a relatively low value of voltage $V_{PGMS}W$. Additionally, since the value of voltage BLKHVsel$_0$ can be relatively high (e.g., greater than 29V) in comparison with some conventional memory devices, the value of a voltage (e.g., $V2=V_{PRGM}$) used to program a memory cell in memory device 200 can be greater than the value of a conventional programming voltage (thereby improving programming operation of memory device 200) without exceeding current breakdown limits associated with programming voltage $V_{PRGM}$.

Figure 5:
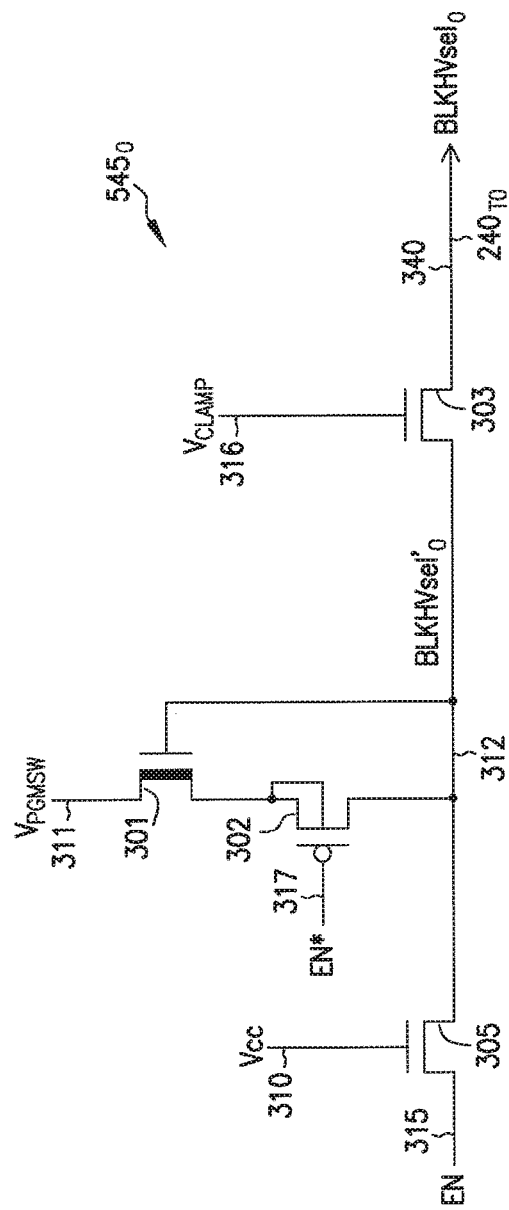
FIG. 5 shows a schematic diagram of a driver select circuit that can be a variation of the driver select circuit of FIG. 3, according to some embodiments described herein.

FIG. 5 shows a schematic diagram of driver select circuit $545_0$ that can be a variation of driver select circuit $245_0$ of FIG. 3, according to some embodiments described herein. Driver select circuit $545_0$ can be used for each of driver select circuit $245_0$ and $245_1$ of memory device 200 of FIG. 2. Thus, each of driver select circuit $245_0$ and $245_1$ of memory device 200 of FIG. 2 can include either elements (e.g., circuit elements) of driver select circuit $245_0$ of FIG. 3 (as described above) or elements (e.g., circuit elements) of driver select circuit $545_0$ of FIG. 5.

As shown in FIG. 5, driver select circuit $545_0$ can include elements similar to or identical to the elements of driver select circuit $245_0$ of FIG. 3. Thus, for simplicity, similar or identical elements are given the same labels and their descriptions are not repeated. Differences between driver select circuit $245_0$ (FIG. 3) and driver select circuit $545_0$ (FIG. 5) include the omission of transistor 304, capacitor C, node 313 (that receives voltage $V_{BSTRAP}$), and node 314.

As described above with reference to FIG. 3 and FIG. 4, transistor 304 and capacitor C can operate to cause (e.g., to increase) the value of voltage $BLKHVsel_0$ at node 340 (FIG. 3) to be greater than the value of voltage $BLKHVsel'_0$ at node 312. The increased voltage (e.g., voltage $BLKHVsel_0$), as described above, allows proper operation of storing information in a memory cell (or memory cells) of block 290.

In FIG. 5, driver select circuit $545_0$ does not include transistor 304 and capacitor C. However, like driver select circuit $245_0$ of FIG. 3, driver select circuit $545_0$ of FIG. 5 can also operate to cause (to increase (e.g., to bootstrap)) the value of voltage $BLKHVsel_0$ at node 340 to be greater than the value of voltage $BLKHVsel'_0$ at node 312. The voltage increasing (e.g., bootstrapping) function in driver select circuit $545_0$ can be performed by a "built-in" coupling capacitor structure that is present in transistors T0 (FIG. 2). For example, during a write operation of storing information in block 290 (FIG. 2), the coupling capacitor structure between transistor gate $240_{T0}$ (which is electrically coupled to node 340) and the body of transistors T0 can cause (increase (e.g., bootstrap)) the value of voltage $BLKHVsel_0$ at node 340 in FIG. 5 to be at a value that is greater than the value of voltage $BLKHVsel'_0$ at node 312 (FIG. 5).

Figure 6:
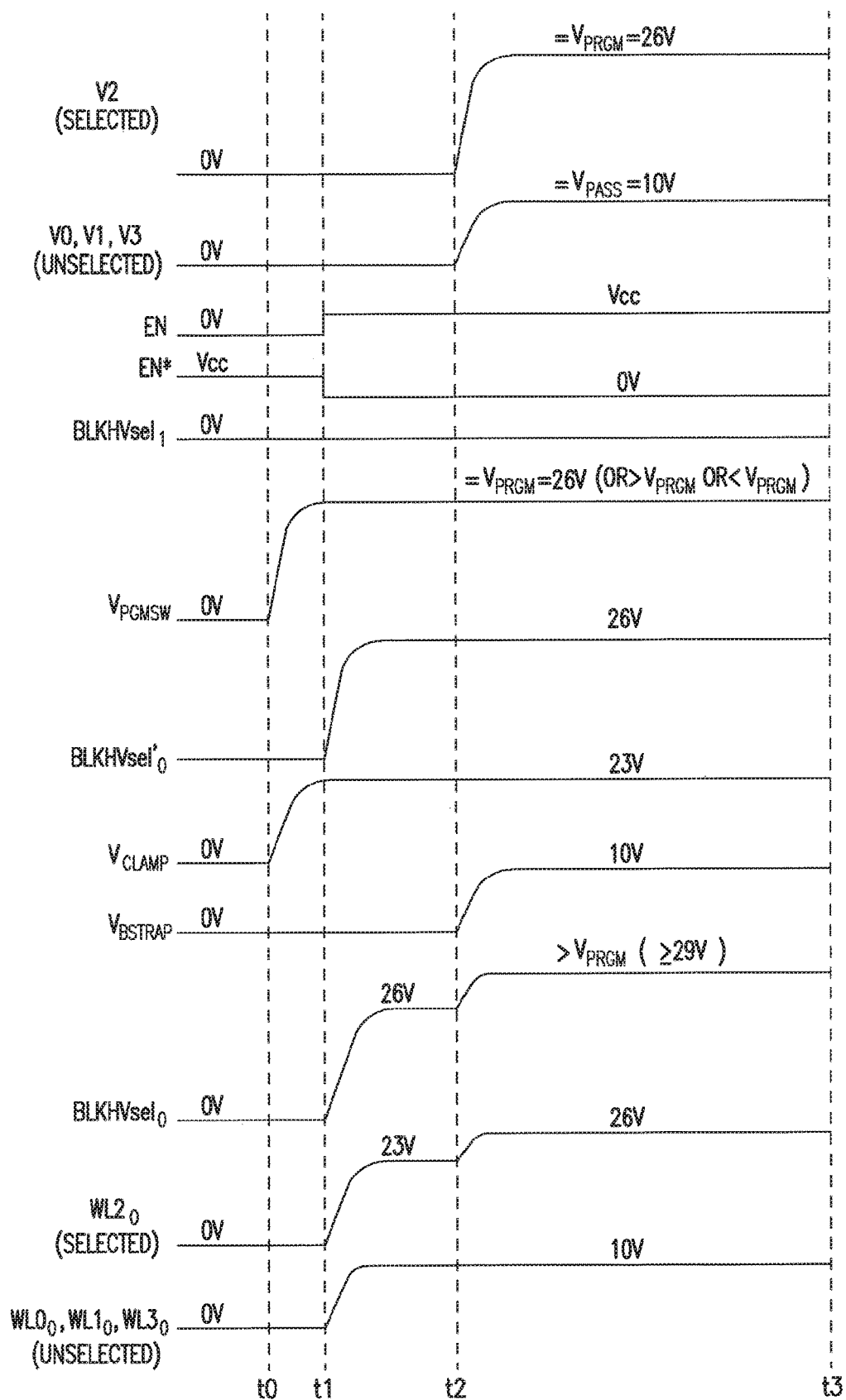
FIG. 6 is a timing diagram for some of the signals of the memory device of FIG. 2 and some of the voltages shown in FIG. 5 during an example write operation of the memory device, according to some embodiments described herein.

FIG. 6 is a timing diagram for some of the signals of memory device 200 of FIG. 2 and some of the voltages shown in FIG. 5 during an example write operation of memory device 200 if driver select circuit $545_0$ of FIG. 5 is used as driver select circuit $245_0$ of FIG. 2, according to some embodiments described herein. The timing diagram of FIG. 6 is similar to the timing diagram of FIG. 4. Thus, for simplicity, similar or identical elements (e.g., signals and voltages) in FIG. 4 and FIG. 6 are given the same labels and their descriptions are not repeated.

Differences between FIG. 4 and FIG. 6 include the timing (e.g., time intervals) at which voltages V0, V1, V2, and V3 from corresponding conductive lines 250', 251', 252', and 253' are applied to (e.g., passed to) respective conductive lines $250_0$, $251_0$, $252_0$, and $253_0$. For example, as shown in FIG. 6, the value of voltage $BLKHVsel_0$ increases from 26V at time t2 (which is the same as the value of voltage $BLKHVsel'_0$=26V at time t2) to a value greater than 26V (e.g., 31V or greater) after time t2 (e.g., between times t2 and t3). The value (e.g., 31V or greater) and timing of voltage $BLKHVsel_0$ of FIG. 6 can be similar to the value and timing, respectively, of voltage $BLKHVsel_0$ of FIG. 4. However, unlike FIG. 4, the values of voltages V0, V1, V2, and V3 in FIG. 6 can be maintained at 0V between times t0 and t2 and may not be allowed to increase until time t2. For example, as shown in FIG. 6, voltage V2 (e.g., associated with a selected global word line) starts to increase from 0V at time t2 to 26V after time t2, and voltages V0, V1, and V3 (e.g., associated with unselected global word lines) start to increase from 0V at time t2 to 10V after time t2.

Thus, as shown in FIG. 6, voltages V0, V1, V2, and V3 can be provided to conductive lines 250', 251', 252', and 253' after the value of voltage $BLKHVsel_0$ reaches (e.g., at time t2) the value of voltage $BLKHVsel'_0$. In comparison, voltages V0, V1, V2, and V3 in FIG. 4 can be provided to conductive lines 250', 251', 252', and 253' before the value of voltage $BLKHVsel_0$ reaches (e.g., at time t2) the value of voltage $BLKHVsel'_0$.

Thus, as shown in FIG. 6, the application (e.g., passing) of voltages V0, V1, V2, and V3 from corresponding conductive lines 250', 251', 252', and 253' to respective conductive lines $250_0$, $251_0$, $252_0$, and $253_0$ can be delayed until after the value of voltage $BLKHVsel_0$ reaches the value of voltage $BLKHVsel'_0$ at time t2. As shown in FIG. 6, the value of voltage $BLKHVsel'_0$ can be at its highest value (e.g., 26V, which can also be the highest value of voltage $V_{PGMSW}$ at time t2). Delaying the application (e.g., the passing) of voltages V0, V1, V2, and V3 from corresponding conductive lines 250', 251', 252', and 253' to respective conductive lines $250_0$, $251_0$, $252_0$, and $253_0$ as described here allows proper operation of the driver circuit (e.g., driver circuit $240_0$ in FIG. 2) associated with a selected block during a write operation of memory device 200. In comparison with some conventional memory devices, driver select circuit $545_0$ allows memory device 200 to have improvements and benefits similar to those of driver select circuit $245_0$ described above with reference to FIG. 3 and FIG. 4.

Figure 7:
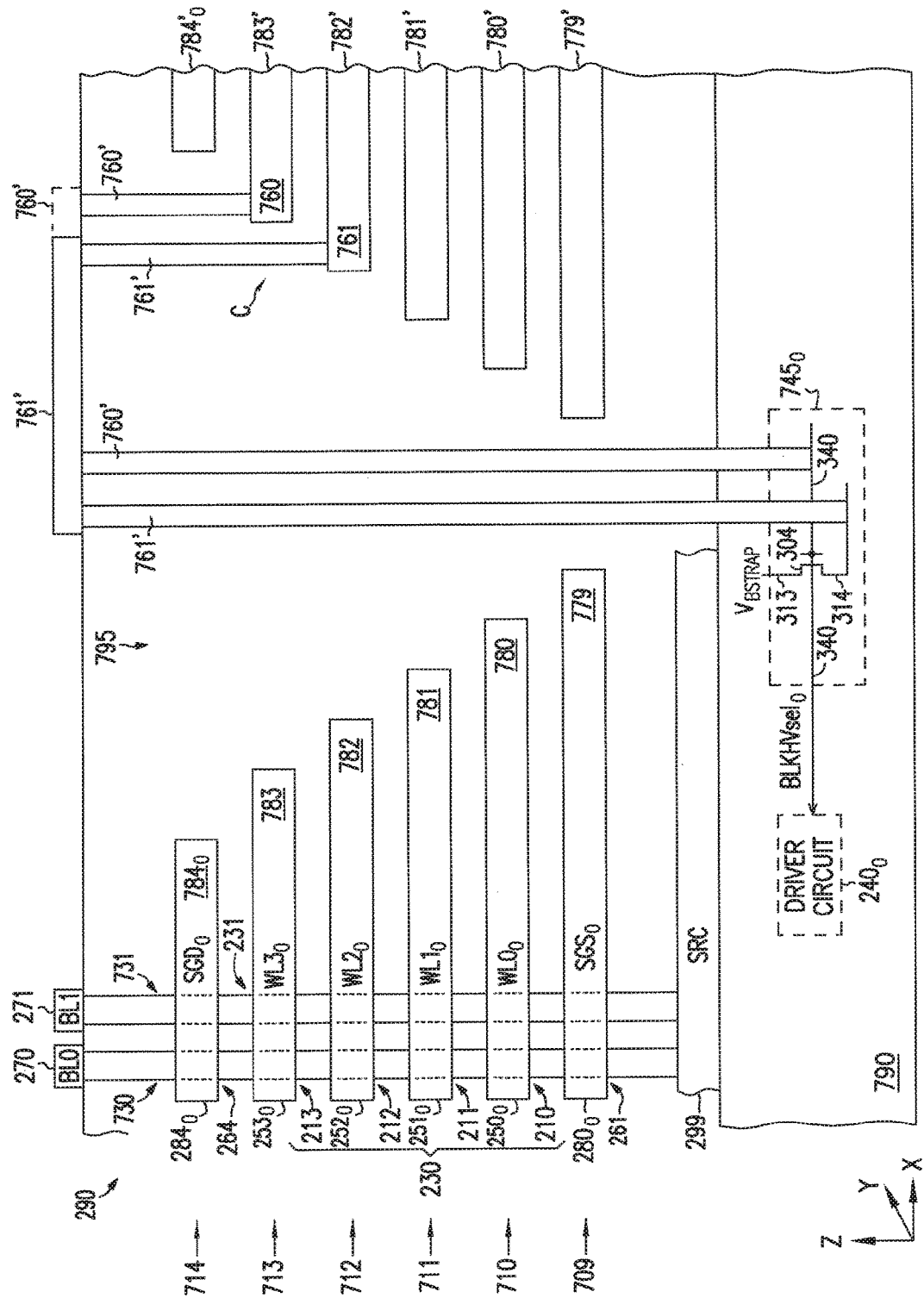
FIG. 7 shows a structure of a portion of a memory device including a structure of a capacitor of a driver select circuit of the memory device, according to some embodiments described herein.

FIG. 7 shows a structure of a portion of memory device 700 including a structure of capacitor C of driver select circuit $745_0$, according to some embodiments described herein. Memory device 700 can include elements similar to (or identical to) the elements of memory device 200. For example, driver circuit $240_0$ and driver select circuit $745_0$ can include elements similar to (or identical to) the elements of driver circuit $240_0$ and driver select circuit $245_0$, respectively, of FIG. 2. For simplicity, similar or identical elements between memory devices 200 and 700 are given the same labels (e.g., same reference numbers). Also for simplicity and to not obscure the embodiments described herein, some of the elements of memory device 700 are schematically (instead of structurally) shown in FIG. 7. Such elements (shown schematically in FIG. 7) include driver circuit $240_0$, and part of driver select circuit $745_0$ including transistor 304, node 313 (that receive voltage $V_{BSTRAP}$), node 314, and node 340. In FIG. 7, node 340 is labeled twice for easy of following the connection of node 340 with other circuit elements of memory device 700.

FIG. 7 shows a side view (in the x-z directions) of a structure of a portion of block 290 of memory device 700. As shown in FIG. 7, memory device 700 can include a substrate 790, which can be a semiconductor substrate. For example, substrate 790 can include an n-type or p-type semiconductor material (e.g., an n-type or p-type silicon substrate).

Memory device 700 includes different levels (e.g., tiers) 709 through 714 with respect to a z-direction, which extends in a direction of the thickness of substrate 790. FIG. 7 also shows an x-direction, which is perpendicular to the z-direction. Levels 709 through 714 are internal physical levels (e.g., physical tiers arranged vertically in the z-direction) of memory device 700.

Memory device 700 can include a group of semiconductor structures through $784_O$ located in respective levels 709 through 714. Semiconductor structures 779 through $784_O$ can be electrically separate layers of semiconductor materials. Semiconductor structures 779 through $784_O$ can include conductively doped polysilicon (e.g., polysilicon doped with impurities (e.g., n-type or different types of impurities)) or other conductively doped semiconductor materials. Thus, each of semiconductor structures 779 through $784_O$ can include n-type (or p-type) polysilicon. Memory device 700 can also include dielectric materials (e.g., silicon dioxide) interleaved with (e.g., located in the spaces between the layers of) semiconductor structures 779 through $784_O$. Such dielectric materials are not shown in FIG. 7 for simplicity. Each of semiconductor structures 779 through $784_O$ can form portions of respective conductive lines (e.g., local access lines or local word lines) $250_O$, $251_O$, $252_O$, and $253_O$ in block 290.

Memory device 700 can include a group of semiconductor structures 779' through $784'_O$ located in respective levels 709 through 714. Semiconductor structures 779' through $784'_O$ can be electrically separate layers of semiconductor materials. Semiconductor structures 779' through $784'_O$ are electrically separated from (e.g., electrically uncoupled to) semiconductor structures 779 through $784'_O$ by a gap 795. Thus, gap 795 can be a location between semiconductor structures 779' through $784'_O$ and semiconductor structures 779 through $784'_O$. Gap 795 can be located at the edge of block 290. Gap 795 can be filled with dielectric material (e.g., silicon dioxide, not shown). Semiconductor structures 779 through $784_O$ and semiconductor structures 779' through $784'_O$ can be formed (e.g., deposited) from the same materials (e.g., the same semiconductor materials) and the same process steps (e.g., formed at the same time). Gap 795 can be formed by removing (e.g., by cutting) a portion (e.g., portion at gap 795) of the materials that form semiconductor structures 779 through $784_O$ and 779' through $784'_O$. Semiconductor structures 779' through $784'_O$ may be an excess portion (e.g., an unused portion) of the materials that form conductive lines $250_O$, $251_O$, $252_O$, and $253_O$. Thus, semiconductor structures 779' through $784'_O$ are not part of conductive lines $250_O$, $251_O$, $252_O$, and $253_O$ of block 290. As described below, semiconductor structures 779' through $784'_O$ can be used to form parts (e.g., conductive plates) of capacitor C (or a multiple of capacitor C) of driver select circuit $745_O$ of memory device 700.

As shown in FIG. 7, memory cells 210, 211, 212, and 213 of memory cell string 230 of block 290 can be located in levels 710, 711, 712, and 713, respectively (e.g., arranged vertically in the z-direction with respect to substrate 790). Memory cells 210, 211, 212, and 213 can be structured as floating gate memory cells, charge trap memory cells, or other types of non-volatile memory cells.

For simplicity, only two data lines 270 and 271 of memory device 700 are shown in FIG. 7. Data lines 270 and 271 can include conductive materials that are formed over semiconductor structures 779 through $784_O$ (e.g., formed above level 714 of memory device 700). Each of data lines 270 and 271 can have a length extending in the y-direction that is perpendicular to the x-direction and z-direction.

Line (e.g., source) 299 of memory device 700 can include a conductive material and have a length extending in the x-direction. Source 299 can be formed under semiconductor structures 779 through $784_O$ (e.g., formed below level 709 of memory device 700). FIG. 7 shows an example where source 299 can be formed over a portion of substrate 790 (e.g., by depositing a conductive material over substrate 790). Alternatively, source 299 can be formed in or formed on a portion of substrate 790 (e.g., by doping a portion of substrate 790).

Driver circuit $240_O$ of memory device 700 can be located in (e.g., formed in or formed on) substrate 790 and below the level 709. Thus, driver circuit $240_O$ can be formed under semiconductor structures 779 through $784_O$ (e.g., formed under the memory cell strings of memory device 700). For simplicity, connections between driver circuit $240_O$ and other components (e.g., conductive lines $250_O$, $251_O$, $252_O$, and $253_O$) are not shown in FIG. 7. Substrate 790 can include other circuitry (not shown in FIG. 7) of memory device 700 such as decoders, and sense and buffer circuitry.

As shown in FIG. 7, memory device 700 can include pillars (e.g., vertical columns of materials) 730 and 731. Each of pillars 730 and 731 can have a length extending through semiconductor structures 779 through $784_O$ in the z-direction. During processes of forming memory device 700, semiconductor structures 779 through $784_O$ can be formed (e.g., deposited one after another in the z-direction over substrate 790). Then, holes can be formed (e.g., vertically formed in the z-direction) through semiconductor structures 779 through $784_O$. After the holes are formed, pillars 730 and 731 can be formed (e.g., vertically formed in the z-direction) in the holes. As shown in FIG. 7, pillars 730 and 731 can contact (e.g., can be electrically coupled to) source 299.

Pillar 730 can include a conductive material contacting data line 270 and source 299. Pillar 730 can form part of a body of memory cell string 230, and bodies of two respectively select transistors 261 and 264 (e.g., source select transistor and drain select transistors, respectively) coupled to memory cell string 230. During a memory operation of memory device 700, pillar 730 can form a current path (e.g., a conductive channel) between data line 270 and source 299 (through respective bodies of select transistors 261 and 264 and memory cell string 230).

Similarly, pillar 731 can include a conductive material contacting data line 271 and source 299. Pillar 731 can form part of a body of memory cell string 231, and bodies of two respectively select transistors 261 and 264 (e.g., source select transistor and drain select transistors, respectively) coupled to memory cell string 231. During a memory operation of memory device 700, pillar 731 can form a current path (e.g., a conductive channel) between data line 271 and source 299 (through respective bodies of select transistors 261 and 264 and memory cell string 231).

As shown in FIG. 7, conductive lines $250_O$, $251_O$, $252_O$, and $253_O$ (associated with signals $WL0_O$, $WL1_O$, $WL2_O$, and $WL3_O$) and respective memory cells 210, 211, 212, and 213 can be located in levels 710, 711, 712, and 713, respectively, along a portion (e.g., the segment extending from level 710 to level 713) of each of pillars 730 and 731.

Select line (e.g., drain select line) $284_O$ can be formed over conductive lines $250_O$, $251_O$, $252_O$, and $253_O$. Select line $284_O$ can be formed from a portion of semiconductor structure $784_O$. As shown in FIG. 7, select line $284_O$ and associated select transistors 264 can be located along a portion (e.g., the segment at level 714) of each of pillars 730 and 731.

Select line (e.g., source select line) $280_O$ can be formed under conductive lines $250_O$, $251_O$, $252_O$, and $253_O$. Select line $280_O$ can be formed from a portion of semiconductor structure 779. As shown in FIG. 7, select line $280_O$ and associated select transistors 261 can be located along a portion (e.g., the segment at level 709) of each of pillars 730 and 731.

As mentioned above, semiconductor structures 779' through 784'$_0$ can be used to form parts (e.g., conductive plates) of capacitor C (or a multiple of capacitor C) of driver select circuit 745$_0$ of memory device 700. Capacitor C can correspond to capacitor C of driver select circuit 245$_0$ of FIG. 3. As shown in FIG. 7, capacitor C can include conductive plates 760 and 761 that can be formed from two of semiconductor structures 779' through 784'$_0$. For example, conductive plates 760 and 761 can be formed from semiconductor structures 782' and 783', respectively. The dielectric of capacitor C can be the dielectric material (not labeled) between semiconductor structures 782' and 783'. FIG. 7 shows an example where each of capacitor plates 760 and 761 includes (e.g., can be formed from) a single (e.g., only one) semiconductor structure among semiconductor structures 779' through 784'$_0$. Alternatively, each of capacitor plates 760 and 761 can include (e.g., can be formed from) multiple semiconductor structures among semiconductor structures 779' through 784'$_0$. For example, capacitor plate 760 can include (e.g., can be formed from) two or three of semiconductor structures 779', 781', and 783' (e.g., odd layers of semiconductor structures 779' through 784'$_0$) and capacitor plate 761 can include (e.g., can be formed from) two or three of semiconductor structures 780', 782', and 784' (e.g., even layers of semiconductor structures 779' through 784'$_0$). In this example, semiconductor structures 781' and 783' (or 779', 781', and 783') can be electrically coupled (e.g., shorted) to each other to form capacitor plate 760, and semiconductor structures 780' and 782' (or 780', 782', and 784') can be electrically coupled (e.g., shorted) to each other to form capacitor plate 761.

As shown in FIG. 7, conductive plates 760 and 761 of capacitor C can be coupled (e.g., electrically coupled) to other components of driver select circuit 745$_0$ through conductive paths 760' and 761', respectively. For example, conductive paths 760' and 761' can be coupled to nodes 340 and 314, respectively. Each of conductive paths 760' and 761' can include a combination of different portions that can include vertical and horizontal conductive segments (not labeled) as shown in FIG. 7. A horizontal conductive segment can have length extending in the x-direction (e.g., parallel to substrate 790). A vertical conductive segment can have length extending in the z-direction (e.g., perpendicular to substrate 790). As shown in FIG. 7, each of conductive paths 760' and 761' can include a portion (e.g., a vertical conductive segment) going through a location where gap 795 is located. The vertical and horizontal conductive segments of each of conductive paths 760' and 761' can be formed from conductive material (e.g., conductively doped polysilicon, metal, or other conductive materials).

FIG. 7 shows memory device 700 including one capacitor C as an example. However, memory device 700 can include a multiple of capacitor C, each with a similar structure, that can be formed from semiconductor structures 779' through 784'$_0$ and the dielectric materials between semiconductor structures 779' through 784'$_0$. In comparison with some conventional memory devices, memory device 700 can have improvements and benefits similar to those of memory device 200 described above with reference to FIG. 2 through FIG. 4.

Figure 8:
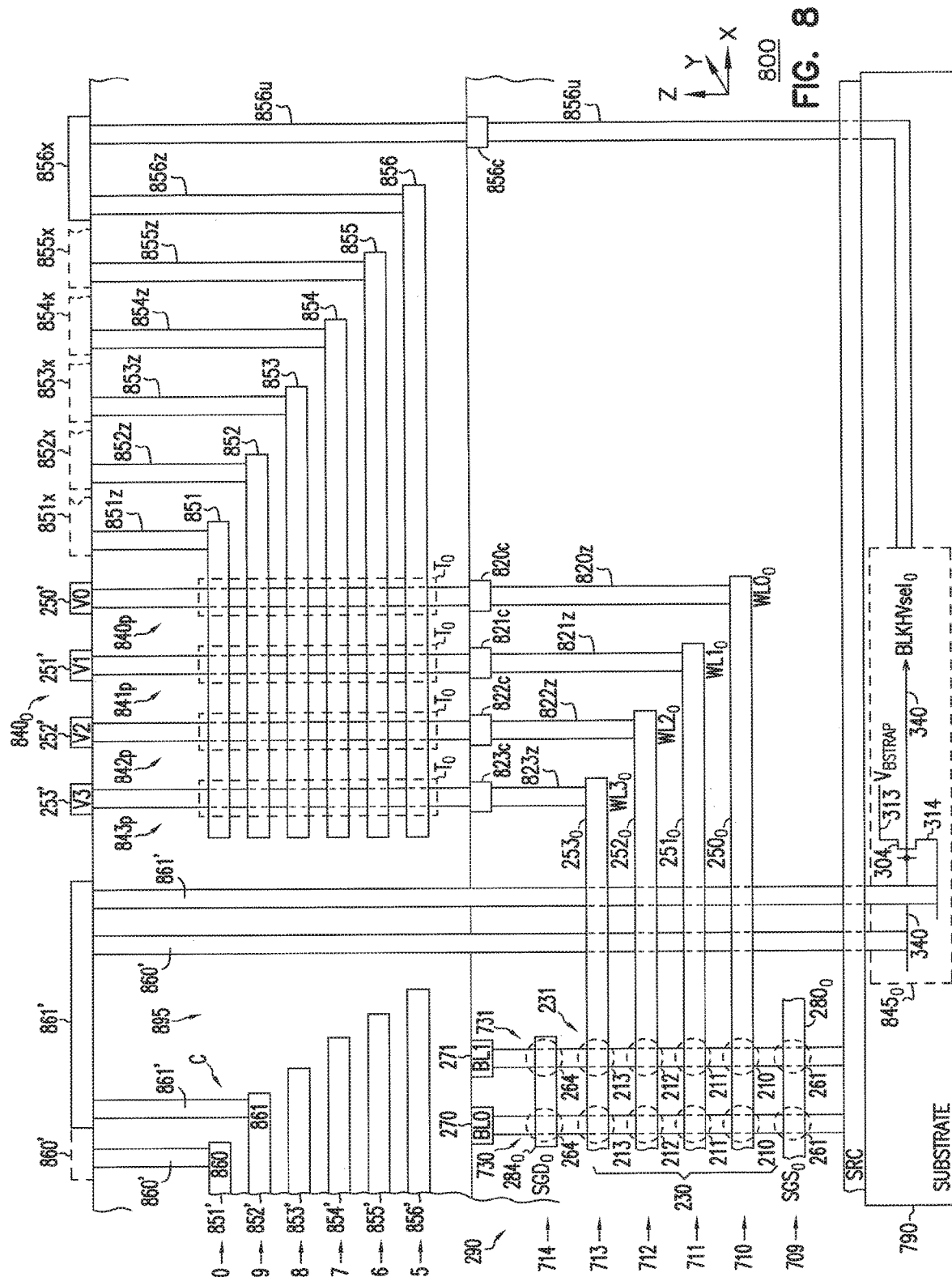
FIG. 8 shows a structure of a portion of another memory device including a structure of a capacitor of a driver select circuit of the memory device, according to some embodiments described herein.

FIG. 8 shows a structure of a portion of a memory device 800 including a structure of a driver circuit 840$_0$ and a capacitor C of driver select circuit 845$_0$, according to some embodiments described herein. Memory device 800 can include elements similar to (or identical to) the elements of memory device 200. For example, driver circuit 840$_0$ and driver select circuit 845$_0$ can include elements similar to (or identical to) the elements of driver circuit 240$_0$ and driver select circuit 245$_0$, respectively, of FIG. 2. For simplicity, similar or identical elements between memory devices 200 and 800 are given the same labels (e.g., same reference numbers). Also for simplicity and to not obscure the embodiments described herein, some of the elements of memory device 800 are schematically (instead of structurally) shown in FIG. 8. Such elements (shown schematically in FIG. 8) part of driver select circuit 845$_0$ including transistor 304, node 313 (that receive voltage V$_{BSTRAP}$), node 314, and node 340. In FIG. 8, node 340 is labeled twice for easy of following the connection of node 340 with other circuit elements of memory device 800.

FIG. 8 shows a side view (in the x-z directions) of a structure of a portion of memory device 800 including a side view of a portion of block 290. Part of the structure of memory device 800 is similar to (or identical to) part of the structure of memory device 700. Thus, for simplicity, similar or identical elements between memory devices 700 and 800 are given the same labels (e.g., same reference numbers) and their descriptions are not repeated.

As shown in FIG. 8, memory device 800 can include conductive segments 820z, 821z, 822z, and 823z (e.g., vertical segments extending in the z-direction) contacting respective conductive lines (e.g., local word lines) 250$_0$, 251$_0$, 252$_0$, and 253$_0$, and conductive contacts 820c, 821c, 822c, and 823c coupled to respective transistors T0 of driver circuit 840$_0$. As shown in FIG. 8 and described below, transistors T0 of part of driver circuit 840$_0$ can be formed vertically with respect to substrate 790. Thus, driver circuit 840$_0$ can be called a vertical string driver circuit (e.g., to access memory cell strings (e.g., 230 and 231 in FIG. 8)) of block 290.

Memory device 800 can include a group of conductive structures (e.g., electrically separated layers of conductive materials) 851 through 856 and a group of conductive structures (e.g., electrically separated layers of conductive materials) 851' through 856' located in (e.g., stacked vertically over) corresponding levels 815 through 820 of memory device 800. Levels 815 through 820 are above levels 709 through 714 with respect to substrate 790. Conductive structures 851' through 856' are electrically separated from (e.g., electrically uncoupled to) conductive structures 851 through 856 by a gap 895. Thus, gap 895 can be a location between conductive structures 851' through 856' and conductive structures 851 through 856. Gap 895 can be filled with a dielectric material (e.g., silicon dioxide, not shown). Conductive structures 851 through 856 can be part of driver circuit 840$_{00}$f memory device 800. Conductive structures 851' through 856' can be used to form parts (e.g., conductive plates) of capacitor C (or a multiple of capacitor C) of driver select circuit 845$_0$ of memory device 800.

Conductive structures 851 through 856 and 851' through 856' can include conductively doped polysilicon (e.g., n-type or p-type polysilicon), metals, or other conductive materials. Memory device 800 can include dielectric materials (e.g., not labeled), interleaved with (e.g., located in the spaces between) conductive structures 851 through 856. Memory device 800 can also include dielectric materials (e.g., not labeled), interleaved with (e.g., located in the spaces between) conductive structures 851' through 856'. Examples of such dielectric materials (interleaved with conductive structures 851 through 856 and 851' through 856') include silicon dioxide.

Conductive structures 851 through 856 and 851' through 856' can be formed (e.g., deposited) from the same materials (e.g., semiconductor materials (e.g., polysilicon)) and the same process steps (e.g., formed at the same time). Gap 895 can be formed by removing (e.g., by cutting) a portion (e.g., portion at gap 895) of the materials that form conductive structures 851 through 856 and 851' through 856'.

As shown in FIG. 8, memory device 800 can include pillars 840$p$, 841$p$, 842$p$, and 843$p$ coupled to conductive lines 250$_0$, 251$_0$, 252$_0$, and 253$_0$, respectively, through respective conductive contacts 820$c$, 821$c$, 822$c$, and 823$c$ and respective conductive segments 820$z$, 821$z$, 822$z$, and 823$z$. Each of pillars 840$p$, 841$p$, 842$p$, and 843$p$ can have length extending in the z-direction (e.g., extending vertically with respect to substrate 790) through conductive structures 851 through 856 and through the dielectric materials (e.g., silicon dioxide) that are interleaved with conductive structures 851 through 856. Pillars 840$p$, 841$p$, 842$p$, and 843$p$ can be part of (e.g., transistor bodies of) respective transistors T0 (transistors T0 are also schematically shown in FIG. 2). Part of conductive structures 851 through 856 can be used as control gates (e.g., transistor gates) to control transistors T0 (e.g., to concurrently turn on transistors T0 or to concurrently turn off transistors T0). For simplicity, only four transistors T0 of driver select circuit 845$_0$ are shown in FIG. 8. Other transistors T0 of driver select circuit 845$_0$ (e.g., transistors T0 that are coupled to select lines 280$_0$ and 284$_0$) are not shown in FIG. 8.

FIG. 8 shows portions (e.g., conductive regions) of conductive lines 250', 251', 252', and 253' (to carry voltages V0, V1, V2, and V3, respectively) that can be formed over and contacting pillars 840$p$, 841$p$, 842$p$, and 843$p$, respectively, of transistors T0. Memory device 800 can include circuitry (e.g., charge pumps (not shown)) located in substrate 790 to provide voltages V0, V1, V2, and V3 to respective conductive lines 250', 251', 252', and 253'.

Memory device 800 can include connections (e.g., conductive connections that can include conductive segments 851$z$ through 856$z$, 851$x$ through 856$x$, and 856$u$) to form conductive paths between respective conductive structures 851 through 856 and driver select circuit 845$_0$. For example, memory device 800 can include a conductive connection that can include conductive segments 856$z$ (e.g., a vertical segment in the z-direction), 856$x$ (e.g., a horizontal segment in the x-direction), and 856$u$ (e.g., a vertical segment in the z-direction) and conductive contact 856$c$ coupled between conductive structure 856 and driver select circuit 845$_0$. Horizontal conductive segments 851$x$ through 855$x$ (and vertical conductive segments similar to conductive segment 856$u$) coupled to respective conductive segments 851$z$ through 855$z$ are hidden from the view of FIG. 8.

As mentioned above, conductive structures 851' through 856' can be used to form parts of capacitor C (or a multiple of capacitor C) of driver select circuit 845$_0$. Capacitor C can correspond to capacitor C of driver select circuit 245$_0$ of FIG. 3. As shown in FIG. 8, capacitor C can include conductive plates 860 and 861 that can be formed from two of conductive structures 851' through 856'. For example, conductive plates 860 and 861 can be formed from conductive structures 851' and 852', respectively. The dielectric of capacitor C can be the dielectric material (not labeled) between conductive structures 851' and 852'. FIG. 8 shows an example where each of capacitor plates 860 and 861 includes (e.g., can be formed from) a single (e.g., only one) conductive structure among conductive structures 851' through 856'. Alternatively, each of capacitor plates 860 and 861 can include (e.g., can be formed from) multiple conductive structures among conductive structures 851' through 856'. For example, capacitor plate 860 can include (e.g., can be formed from) two or three of conductive structures 851', 853', and 855' (e.g., odd layers of conductive structures 851' through 856') and capacitor plate 861 can include (e.g., can be formed from) two or three of conductive structures 852', 854', and 856' (e.g., even layers of conductive structures 851' through 856'). In this example, conductive structures 851' and 853' (or 851', 853', and 855') can be electrically coupled (e.g., shorted) to each other to form capacitor plate 860, and conductive structures 852' and 854' (or 852', 854', and 856') can be electrically coupled (e.g., shorted) to each other to form capacitor plate 861.

As shown in FIG. 8, conductive plates 860 and 861 of capacitor C can be coupled (e.g., electrically coupled) to other components of driver select circuit 845$_0$ through conductive paths 860' and 861', respectively. For example, conductive paths 860' and 861' can be coupled to nodes 340 and 314, respectively. Each of conductive paths 860' and 861' can include a combination of different portions that can include vertical and horizontal conductive segments (not labeled) as shown in FIG. 8. A horizontal conductive segment can have length extending in the x-direction (e.g., parallel to substrate 790). A vertical conductive segment can have length extending in the z-direction (e.g., perpendicular to substrate 790). As shown in FIG. 8, each of conductive paths 860' and 861' can include a portion (e.g., a vertical conductive segment) going through a location where gap 895 is located. The vertical and horizontal conductive segments of each of conductive paths 860' and 861' can be formed from conductive material (e.g., conductively doped polysilicon, metal, or other conductive materials).

FIG. 8 shows memory device 800 including one capacitor C as an example. However, memory device 800 can include a multiple of capacitor C, each with a similar structure, that can be formed from conductive structures 851' through 856' (and the dielectric materials between conductive structures 851' through 856'). In comparison with some conventional memory devices, memory device 800 can have improvements and benefits similar to those of memory device 200 described above with reference to FIG. 2 through FIG. 4

The illustrations of apparatuses (e.g., memory devices 100, 200, 700, and 800) and methods (e.g., operating methods associated with memory devices 100, 200, 700, and 800) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, and 800) or a system (e.g., a computer, a cellular phone, or other electronic systems) that includes a device such as any of memory devices 100, 200, 700, and 800.

Any of the components described above with reference to FIG. 1 through FIG. 8 can be implemented in a number of ways, including simulation via software. Thus, apparatuses (e.g., memory devices 100, 200, 700, and 800 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 700, and 800 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses, and methods of operating the apparatuses. Some of the apparatuses include a first memory cell string; a second memory cell string; a first group of conductive lines to access the first and second memory cell strings; a second group of conductive lines; a group of transistors, each transistor of the group of transistors coupled between a respective conductive line of the first group of conductive lines and a respective conductive line of the second group of conductive lines, the group of transistors having a common gate; and a circuit including a first transistor and a second transistor coupled in series between a first node and a second node, the first transistor including a gate coupled to the second node, and a third transistor coupled between the second node and the common gate. Other embodiments including additional apparatuses and methods are described.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A. B. and C. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a first group of semiconductor structures located in different levels of the apparatus and located over a substrate;
    a pillar extending through the first group of semiconductor structures, the pillar being part of a memory cell string;
    a second group of semiconductor structures located in the different levels, the second group of semiconductor structures being electrically separated from the first group of semiconductor structures;
    a capacitor including a first conductive plate formed from part of a first semiconductor structure of the second group of semiconductor structures, and a second conductive plate formed from part of a second semiconductor structure of the second group of semiconductor structures;
    a first conductive path coupled between the first conductive plate of the capacitor and a first node;
    a second conductive path coupled between the second conductive plate of the capacitor and a second node;
    a first transistor and a second transistor coupled in series between a third node and a fourth node, the first transistor including a gate directly coupled to the fourth node;
    a third transistor including a first terminal directly coupled to the fourth node and a second terminal directly coupled to the first node; and
    a fourth transistor having a gate directly coupled to the first node and a terminal coupled to the second conductive plate of the capacitor.

2. The apparatus of claim 1, wherein each of the first and second groups of semiconductor structures includes conductively doped polysilicon.

3. The apparatus of claim 1, wherein each of the first and third transistors includes a depletion-mode transistor.

4. The apparatus of claim 1, further comprising a group of transistors having a common gate coupled to the first node.

5. An apparatus comprising:
    a first group of semiconductor structures located in different levels of the apparatus and located over a substrate;
    a pillar extending through the first group of semiconductor structures, the pillar being part of a memory cell string;
    a second group of semiconductor structures located in the different levels, the second group of semiconductor structures being electrically separated from the first group of semiconductor structures;
    a capacitor including a first conductive plate formed from part of a first semiconductor structure of the second group of semiconductor structures, and a second conductive plate formed from part of a second semiconductor structure of the second group of semiconductor structures;
    a first conductive path coupled between the first conductive plate of the capacitor and a first node;
    a second conductive path coupled between the second conductive plate of the capacitor and a second node;
    a first transistor and a second transistor coupled in series between a third node and a fourth node, the first transistor including a gate coupled to the fourth node; and
    a third transistor coupled between the fourth node and the first node, wherein:

the first conductive path includes a first conductive segment going through a location between the first group of semiconductor structures and the second group of semiconductor structures; and the second conductive path includes a second conductive segment going through the location between the first group of semiconductor structures and the second group of semiconductor structures.

6. The apparatus of claim 5, wherein:

the first conductive path includes a first additional conductive segment coupled to the first conductive segment, the first additional conductive segment having a length extending perpendicularly to the first conductive segment; and the second conductive path includes a second additional conductive segment coupled to the second conductive segment, the second additional conductive segment having a length extending perpendicularly to the second conductive segment.

7. An apparatus comprising:

a group of semiconductor structures located in different levels of the apparatus and over a substrate;

a pillar extending through the group of semiconductor structures, the pillar being part of a memory cell string;

a group of conductive structures located over the group of semiconductor structures, the group of conductive structures being electrically separated from the group of semiconductor structures;

a capacitor including a first conductive plate formed from part of a first conductive structure of the group of conductive structures, and second conductive plate formed from part of a second conductive structure of the group of conductive structures;

a first conductive path coupled between the first conductive plate of the capacitor and a first node;

a second conductive path coupled between the second conductive plate of the capacitor and a second node;

a first transistor and a second transistor coupled in series between a third node and a fourth node, the first transistor including a gate directly coupled to the fourth node;

a third transistor including a first terminal directly coupled to the fourth node and a second terminal directly coupled to the second node; and a fourth transistor having a gate directly coupled to the first node and a terminal coupled to the second conductive plate of the capacitor.

8. The apparatus of claim 7, wherein each of the group of semiconductor structures and the group of conductive structures includes conductively doped polysilicon.

9. The apparatus of claim 7, wherein each of the first and third transistors includes a depletion-mode transistor.

10. The apparatus of claim 7, further comprising:

a fourth transistor coupled between the first node and a fifth node.

11. An apparatus comprising:

a group of semiconductor structures located in different levels of the apparatus and over a substrate;

a pillar extending through the group of semiconductor structures, the pillar being part of a memory cell string;

a group of conductive structures located over the group of semiconductor structures, the group of conductive structures being electrically separated from the group of semiconductor structures;

a capacitor including a first conductive plate formed from part of a first conductive structure of the group of conductive structures, and second conductive plate formed from part of a second conductive structure of the group of conductive structures;

a first conductive path coupled between the first conductive plate of the capacitor and a first node;

a second conductive path coupled between the second conductive plate of the capacitor and a second node;

a first transistor and a second transistor coupled in series between a third node and a fourth node, the first transistor including a gate coupled to the fourth node;

a third transistor coupled between the fourth node and the second node;

an additional group of conductive structures located in the levels that the group of conductive structures is located; and an additional pillar extending through the additional group of conductive structures, the additional pillar being electrically coupled to a semiconductor structure of the group of semiconductor structures.

12. The apparatus of claim 11, wherein:

the first conductive path includes a first conductive segment going through a location between the group of conductive structures and the additional group of conductive structures; and the second conductive path includes a second conductive segment going through the location between the group of conductive structures and the additional group of conductive structures.

13. The apparatus of claim 12, wherein:

the first conductive path includes a first additional conductive segment coupled to the first conductive segment, the first additional conductive segment having a length extending perpendicularly to the first conductive segment; and the second conductive path includes a second additional conductive segment coupled to the second conductive segment, the second additional conductive segment having a length extending perpendicularly to the second conductive segment.

* * * * *